United States Patent
Li et al.

(10) Patent No.: US 9,685,481 B2
(45) Date of Patent: Jun. 20, 2017

(54) MONOLITHIC VISIBLE-INFRARED FOCAL PLANE ARRAY ON SILICON

(71) Applicant: International Business Machines Corporation, Armonk, NY (US)

(72) Inventors: Ning Li, White Plains, NY (US); Devendra K. Sadana, Pleasantville, NY (US); Robert L. Wisnieff, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/196,307

(22) Filed: Jun. 29, 2016

(65) Prior Publication Data
US 2016/0372502 A1    Dec. 22, 2016

Related U.S. Application Data

(62) Division of application No. 14/744,210, filed on Jun. 19, 2015, now Pat. No. 9,472,588.

(51) Int. Cl.
*H01L 21/00* (2006.01)
*H01L 27/146* (2006.01)
(Continued)

(52) U.S. Cl.
CPC ...... *H01L 27/1469* (2013.01); *H01L 27/1465* (2013.01); *H01L 27/14634* (2013.01); *H01L 27/14647* (2013.01); *H01L 27/14652* (2013.01); *H01L 27/14694* (2013.01); *H01L 31/028* (2013.01); *H01L 31/0304* (2013.01); *H01L 31/105* (2013.01)

(58) Field of Classification Search
CPC  H01L 27/1469; H01L 31/028; H01L 31/0304

USPC .......................................................... 438/73
See application file for complete search history.

(56) References Cited

U.S. PATENT DOCUMENTS

| 5,479,032 A | 12/1995 | Forrest et al. |
| 5,518,934 A | 5/1996 | Forrest et al. |

(Continued)

FOREIGN PATENT DOCUMENTS

DE        102012214690 A1    2/2014

OTHER PUBLICATIONS

Machine Translation of DE 10 2012 214 690 A1.

*Primary Examiner* — Anthony Ho
(74) *Attorney, Agent, or Firm* — Harrington & Smith; Louis J. Percello

(57) ABSTRACT

A structure includes a silicon substrate; silicon readout circuitry disposed on a first portion of a top surface of the substrate and a radiation detecting pixel disposed on a second portion of the top surface of the substrate. The pixel has a plurality of radiation detectors connected with the readout circuitry. The plurality of radiation detectors are composed of at least one visible wavelength radiation detector containing germanium and at least one infrared wavelength radiation detector containing a Group III-V semiconductor material. A method includes providing a silicon substrate; forming silicon readout circuitry on a first portion of a top surface of the substrate and forming a radiation detecting pixel, on a second portion of the top surface of the substrate, that has a plurality of radiation detectors formed to contain a visible wavelength detector composed of germanium and an infrared wavelength detector composed of a Group III-V semiconductor material.

20 Claims, 13 Drawing Sheets

(51) Int. Cl.
*H01L 31/105* (2006.01)
*H01L 31/0304* (2006.01)
*H01L 31/028* (2006.01)

(56) References Cited

U.S. PATENT DOCUMENTS

| | | |
|---|---|---|
| 5,981,950 A | 11/1999 | Wolny et al. |
| 6,107,618 A | 8/2000 | Fossum et al. |
| 6,407,439 B1 | 6/2002 | Hier et al. |
| 7,592,593 B2 | 9/2009 | Kauffman et al. |
| 7,838,869 B2 | 11/2010 | Perera et al. |
| 7,972,885 B1 | 7/2011 | Dutta et al. |
| 8,035,184 B1 | 10/2011 | Dutta et al. |
| 8,299,485 B2 | 10/2012 | Celler |
| 2013/0193308 A1 | 8/2013 | Cellek et al. |
| 2014/0138543 A1 | 5/2014 | LaVeigne |

$In_{0.52}Ga_{0.48}As$ Photodetector Structure, 54

| p-type $In_{0.52}Al_{0.48}As$, Zn, 5E18 cm$^{-3}$, 200nm |
|---|
| Undoped $In_{0.53}Ga_{0.47}As$, 1000nm |
| n-type InP, Si, 5E18 cm$^{-3}$, 200nm |

FIG. 6C

$In_{0.82}Ga_{0.18}As$ Photodetector Structure, 56

| p-type $In_{0.82}Ga_{0.18}As$, Zn, 5E18 cm$^{-3}$, 200nm |
|---|
| Undoped $In_{0.82}Ga_{0.18}As$, 1000nm |
| n-type $In_{0.82}Ga_{0.18}As$, 5E18 cm$^{-3}$, 200nm |

FIG. 6D

Quantum Dot Infrared Photodetector Structure

Type II Heterojunction Infrared Photodetector Structure

MONOLITHIC VISIBLE-INFRARED FOCAL PLANE ARRAY ON SILICON

CROSS-REFERENCE TO A RELATED PATENT APPLICATION

This patent application is a divisional patent application of copending U.S. patent application Ser. No. 14/744,210, filed Jun. 19, 2015, the disclosure of which is incorporated by reference herein in its entirety.

TECHNICAL FIELD

The various embodiments of this invention relate generally to semiconductor devices and fabrication techniques and, more specifically, relate to the fabrication of semiconductor detectors of electromagnetic (EM) radiation including EM radiation in the visible and the infrared (IR) wavelength bands.

BACKGROUND

Visible to IR responsive focal plane arrays (FPAs) have applications in night vision devices and various sensing and imaging applications. The current dominant technology uses Group II-VI semiconductor materials such as HgCdTe for detecting IR radiation. However, conventional HgCdTe detectors can exhibit manufacturing and performance issues including, for example, non-uniformity and a difficulty to scale up.

SUMMARY

An aspect of the non-limiting embodiments of this invention is a structure that comprises a silicon substrate; silicon readout circuitry disposed on a first portion of a top surface of the silicon substrate; and a radiation detecting pixel disposed on a second portion of the top surface of the silicon substrate. The radiation detecting pixel is comprised of a plurality of radiation detectors connected with the silicon readout circuitry. In the structure the plurality of radiation detectors are comprised of at least one visible wavelength radiation detector comprised of germanium and at least one infrared wavelength radiation detector comprised of a Group III-V semiconductor material.

Another aspect of the non-limiting embodiments of this invention is a method that comprises providing a silicon substrate; forming silicon readout circuitry on a first portion of a top surface of the silicon substrate; and forming a radiation detecting pixel on a second portion of the top surface of the silicon substrate. The radiation detecting pixel is comprised of a plurality of radiation detectors connected with the silicon readout circuitry. The plurality of radiation detectors are formed to comprise at least one visible wavelength radiation detector comprised of germanium and at least one infrared wavelength radiation detector comprised of a Group III-V semiconductor material.

BRIEF DESCRIPTION OF THE SEVERAL VIEWS OF THE DRAWINGS

FIGS. 1-12 are each an enlarged cross-sectional view showing various initial, intermediate and completed or substantially completed multi-wavelength photodetector structures and photodetectors that are fabricated in accordance with embodiments of this invention, wherein the various layer thicknesses and other dimensions are not necessarily drawn to scale. More specifically:

FIG. 1 shows for a first, vertically stacked photodetector, bottom side illuminated embodiment a starting structure comprised of a silicon substrate having an overlying BOX layer and a semiconductor on insulator (SOI) layer comprised of Ge that functions as a buffer layer;

FIG. 2 shows a result of an etching process where a portion of the Ge layer and the underlying BOX layer are removed to expose a surface of the silicon substrate in what may be referred to as a circuit region wherein CMOS readout circuits are fabricated;

FIG. 3 illustrates a result of several sequentially performed processing steps that grow a layer of protective oxide to cover the CMOS circuitry followed by a succession of semiconductor epitaxial deposition steps to grow stacked photodetectors, first the visible photodetector followed by the IR photodetector; and FIG. 4 illustrates a result of several sequentially performed processing steps to form a mesa structure from the dual-wavelength range photodetector stack and to fabricate contacts and vertical and horizontal interconnects between the photodetectors and the CMOS readout circuitry.

FIG. 5 shows an alternate embodiment of the vertically stacked photodetector structure that eliminates the BOX layer and grows the Ge buffer layer directly on the silicon substrate.

FIGS. 6A, 6B, 6C, 6D, 6E and 6F, collectively referred to as FIG. 6, each show an enlarged, non-limiting embodiment of a photodetector used in the front-side illuminated FPA embodiment of FIGS. 7-10, where FIG. 6A shows a non-limiting example of a GaAs photodetector structure;

FIG. 6B shows a non-limiting example of a Ge photodetector structure;

FIG. 6C shows a non-limiting example of a first InGaAs photodetector structure;

FIG. 6D shows a non-limiting example of a second InGaAs photodetector structure;

FIG. 6E shows a non-limiting example of a quantum dot IR photodetector structure; and FIG. 6F shows a non-limiting example of a Type II heterojunction IR photodetector structure.

FIG. 7 shows for a first, lateral photodetector front-side illuminated embodiment a starting structure comprised of a silicon substrate having an overlying BOX layer and an SOI comprised of Ge, and a result of the formation of CMOS readout circuitry, the formation of an oxide layer, the opening of an aperture in the oxide layer and the fabrication of a first photodetector (a visible wavelength GaAs photodetector) in the aperture;

FIG. 8 shows a result of the opening of a second aperture in the oxide layer and the fabrication of a second photodetector (a visible wavelength Ge photodetector) in the second aperture; and FIG. 9 shows a completed lateral photodetector FPA after fabrication of two lateral IR Group III-V photodetectors and the formation of interconnects between the visible and IR photodetectors and the CMOS readout circuitry.

FIG. 10 shows a non-limiting example of a bulk (non-SOI) Si substrate front-side illuminated FPA embodiment that forms a recess in the Si substrate wherein the photodetectors are fabricated.

FIGS. 11 and 12 illustrate the fabrication of a back-side illuminated FPA embodiment that uses photoconductive Ge and Group III-V detectors as opposed to the photodetector embodiments described thus far.

DETAILED DESCRIPTION

Figure 1:
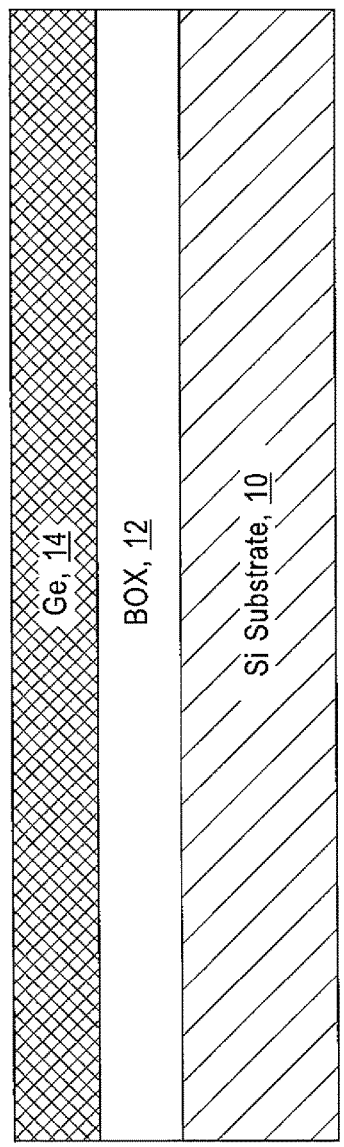

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatuses that are suitable for use in implementing the embodiments of this invention include, but are not limited to, rapid thermal chemical vapor deposition (RTCVD), low-energy plasma deposition (LEPD), ultra-high vacuum chemical vapor deposition (UHVCVD), atmospheric pressure chemical vapor deposition (APCVD), molecular beam epitaxy (MBE) and chemical vapor deposition (CVD). The temperature for an epitaxial deposition process typically ranges from about 550° C. to about 900° C. Although higher temperature will typically result in faster deposition of the semiconductor material, the faster deposition may also result in crystal defects and film cracking.

Visible EM radiation can be characterized as having a wavelength in a range of about 380 nm to about 760 nm Infrared EM radiation can be characterized as having a wavelength in a range of about 750 nm to about 2500 nm (2.5 µm, near IR). Mid-IR radiation can be characterized as having a wavelength in a range of about 2.5 µm to about 10 µm, while far IR radiation can be characterized as having a wavelength in a range of about 10 µm to about 1000 µm.

In at least one embodiment thereof this invention can employ semiconductor on insulator (SOI) technology where a thin semiconductor layer, e.g., Ge, is formed over an insulating layer, such as silicon oxide, which in turn is formed over a (bulk) substrate, such as a Si substrate. The insulating layer can be referred to as a buried oxide (BOX) layer or simply as a BOX.

It is pointed out that while certain aspects and embodiments of this invention can be employed with SOI substrates, the invention can also be realized using bulk (e.g., silicon) substrates.

The exemplary embodiments of this invention use Group III-V and Si, Ge monolithic integration to fabricate a visible and an IR responsive FPA that reduces cost and improves performance. The embodiments enable a monolithic structure to be formed wherein silicon-based CMOS readout circuitry is fabricated in conjunction with Ge-based visible detectors (e.g., responsive to wavelengths in a range of about 400 nm to about 1.3 microns), and Group III-V based IR detectors (e.g., responsive to wavelengths in a range of about 1.3 microns to about 2.6 microns (or longer)).

The embodiments of this invention are described below in the context of a vertical structure intended for back-side illumination and a lateral structure intended for front-side illumination. The vertical, back-side illuminated structure will be described first with reference to FIGS. 1-5.

FIG. 1 shows a cross-sectional enlarged view of a starting structure comprised of a silicon substrate 10 having an overlying BOX layer 12 and a semiconductor on insulator (SOI) layer 14 comprised of Ge. The silicon substrate 10 can have any desired thickness (it is subsequently thinned). The BOX layer 12 can have an exemplary thickness of about 100 nm and the Ge layer 14 can have an exemplary thickness of about 50 nm.

Figure 2:
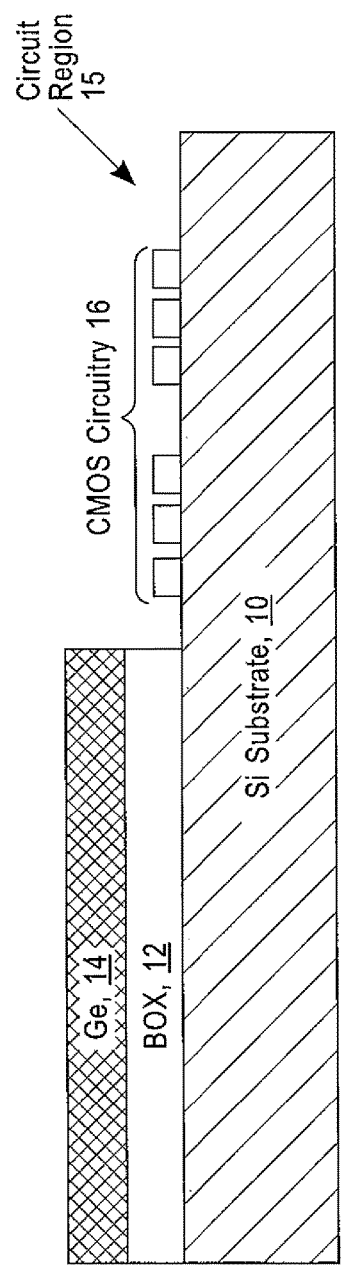

FIG. 2 shows a result of an etching process (a multi-step etching process) where a portion of the Ge layer 14 and the underlying BOX layer 12 are removed to expose a surface of the silicon substrate 10 in what may be referred to as a circuit region 15. In the circuit region 15 is formed by conventional silicon processing CMOS readout and support circuitry 16 for the subsequently formed visible and IR radiation detectors. A typical maximum processing temperature that is achieved during the CMOS processing is about 1000° C. (prior to a siliciding step). It can be noted that it is a feature of this invention to perform such high temperature processing prior to the epitaxial deposition of Group III-V material layers.

Figure 3:
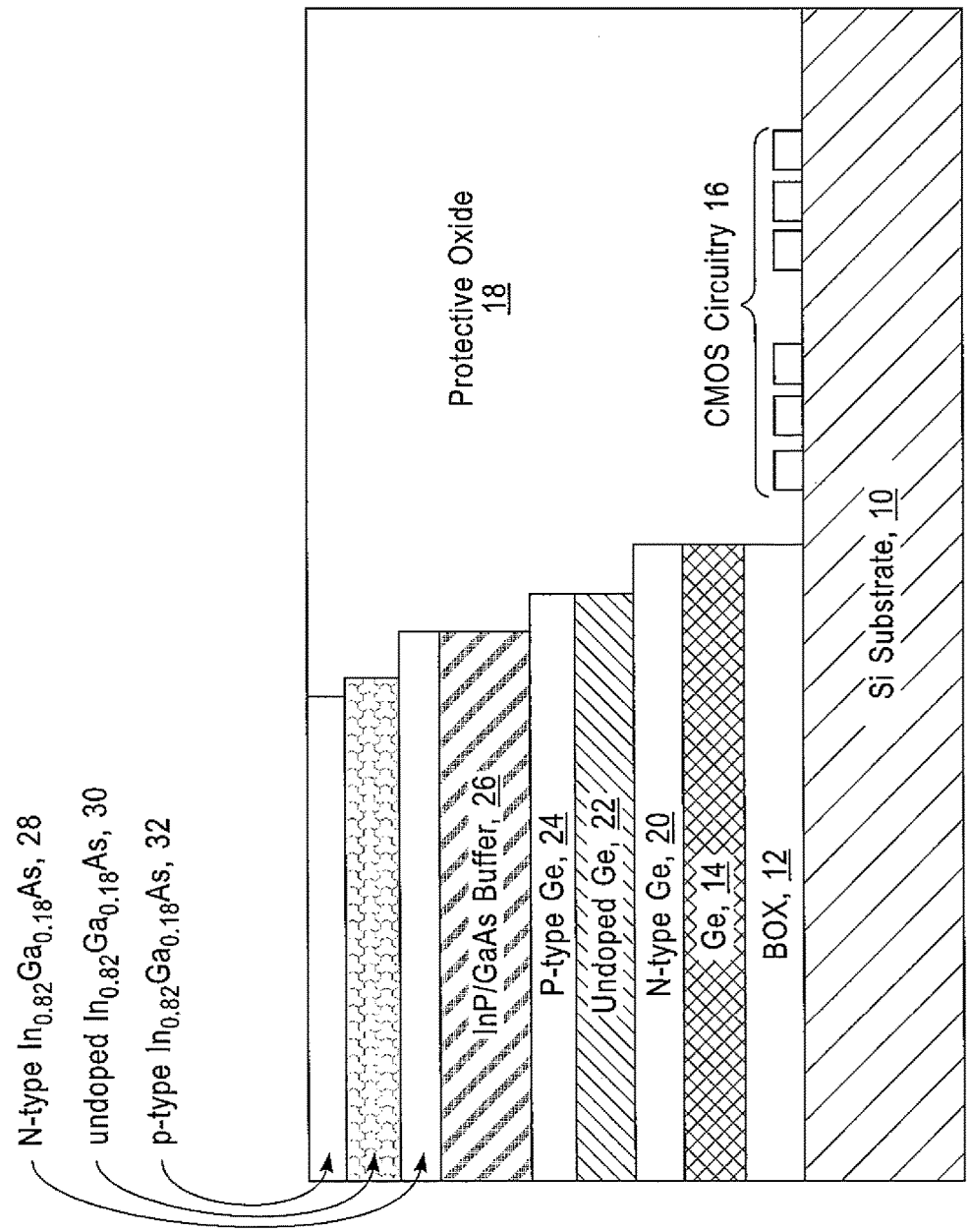

FIG. 3 illustrates a result of several sequentially performed processing steps. First, a layer of protective oxide 18 (e.g., $SiO_2$) is grown so as to cover the CMOS circuitry 16. The oxide layer 18 is then selectively removed so as to expose the top surface of the Ge layer 14 in what will be a region containing the vertically stacked photodetectors. The Ge layer 14 may be considered to function as a Ge buffer layer. Next a succession of semiconductor epitaxial deposition steps are performed to grow the stacked photodetectors, first the visible photodetector followed by the IR photodetector. Both photodetectors are formed to have a P-N junction, where the visible photodetector is formed in this non-limiting embodiment as a P-I-N (P-intrinsic-N) junction and where the IR photodetector is formed in this non-limiting embodiment also as a P-I-N junction.

In general the photo detectors (sensors) of this and other embodiments can operate with a fixed bias voltage and output a current to the CMOS circuitry 16.

In the illustrated (non-limiting) embodiment an N-type Ge layer 20 is grown on the starting Ge (buffer) layer 14 to have a thickness of about 200 nm. The N-type Ge layer 20 can be doped with, for example, Arsenic with a dopant concentration of about 5E18 $cm^{-3}$. A substantially undoped intrinsic Ge layer 22 is then grown to have a thickness of about 1000 nm, followed by the growth of a P-type Ge layer 24 having a thickness of about 200 nm. The P-type Ge layer 24 can be doped with, for example, Boron with a dopant concentration of about 5E18 $cm^{-3}$. The layers 20, 22 and 24 will function in the final structure as the visible P-I-N photodetector.

Next a sequence of layers of Group III-V material is grown to form the IR photodetector. A first step in this process grows a substantially undoped InP/GaAs buffer layer 26 on the P-type Ge layer 24. A thickness of the InP/GaAs buffer layer 26 can be about 1 micron. This is followed by the growth of an N-type InGaAs layer 28 having, in a non-limiting embodiment, the composition $In_{0.82}Ga_{0.18}As$. The layer 28 can have a thickness of about 200 nm and is doped N-type using, for example, Si with a dopant concentration of about 5E18 $cm^{-3}$. This is followed by the growth of a substantially undoped (intrinsic) layer of InGaAs layer 30 having, in a non-limiting embodiment, the composition $In_{0.82}Ga_{0.18}As$. The layer 30 can have a thickness of about 1000 nm. This is followed by the growth of a P-type InGaAs layer 32 having, in a non-limiting embodiment, the composition $In_{0.82}Ga_{0.18}As$. The layer 32 can have a thickness of about 200 nm and is doped P-type using, for example, Zn with a dopant concentration of about 5E18 $cm^{-3}$. The layers 28, 30 and 32 will function in the final structure as the IR P-I-N photodetector.

Figure 4:
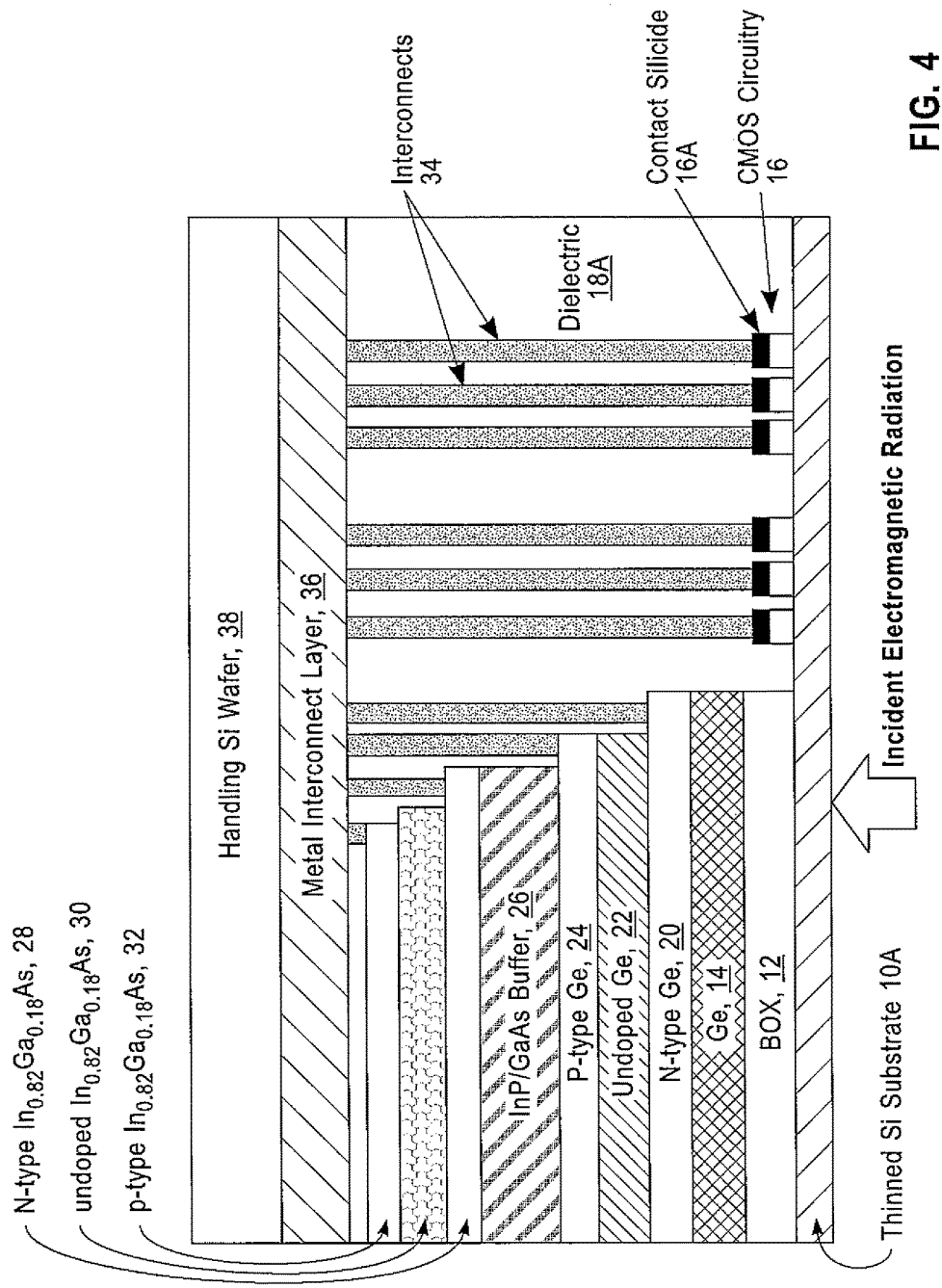

FIG. 4 also illustrates a result of several sequentially performed processing steps. First, the oxide layer 18 can be removed in whole or in part and the dual-wavelength range photodetector stack composed of the layers 14-32 is etched using a multi-step etching and masking process to form a mesa structure having staggered, upwardly sloping sidewalls. Next contacts are formed on exposed edge portions of the layers 20, 24, 28 and 32, followed by the growth of a dielectric layer 18A. The top surface of the dielectric layer 18A is then planarized and openings are formed to the individual CMOS circuits 16 and to the contacts formed on the edges of the layers 20, 24, 28 and 32. CMOS circuitry contact silicide 16A is then formed on the CMOS circuits 16 at a temperature of about 400° C. This is followed by the formation of vertical conductive interconnects 34 (e.g., Cu, Al, Au, etc.) to the silicided contacts 16A and to the contacts formed on the edge portions of the layers 20, 24, 28 and 32. A metal interconnect layer 36 is then formed by applying a dielectric and patterning lateral conductors to interconnect the vertical interconnects to the CMOS readout circuitry 16 to the individual photodetectors via the contacts on the edge portions of the layers 20, 24, 28 and 32 and their associated vertical interconnects. A handling (handle) wafer 38 (e.g., a Si handle wafer) is then applied over the metal interconnect layer 36 to provide structural support, followed by thinning of the Si substrate 10. As the bottom surface of the thinned Si substrate 10A functions as a receiving surface for incident EM radiation in this back-side illuminated embodiment, one suitable thickness for the thinned Si substrate 10A is about 100 nm or less. With this thickness the Si substrate 10A is substantially transparent to the incident EM radiation.

In operation the incident EM radiation passes through the Si substrate 10A and the substantially transparent (at the wavelengths of interest) BOX layer 12. The shorter visible wavelengths are substantially absorbed in the Ge P-I-N photodetector to generate first photocarriers, while the longer wavelength IR radiation passes through the layers that comprise the Ge P-I-N photodetector is substantially absorbed in the InGaAs P-I-N photodetector to generate second photocarriers. These generated photocarriers are transported to the CMOS readout circuitry 16 via the metal interconnect layer 36 and the vertical interconnects 34.

Figure 5:
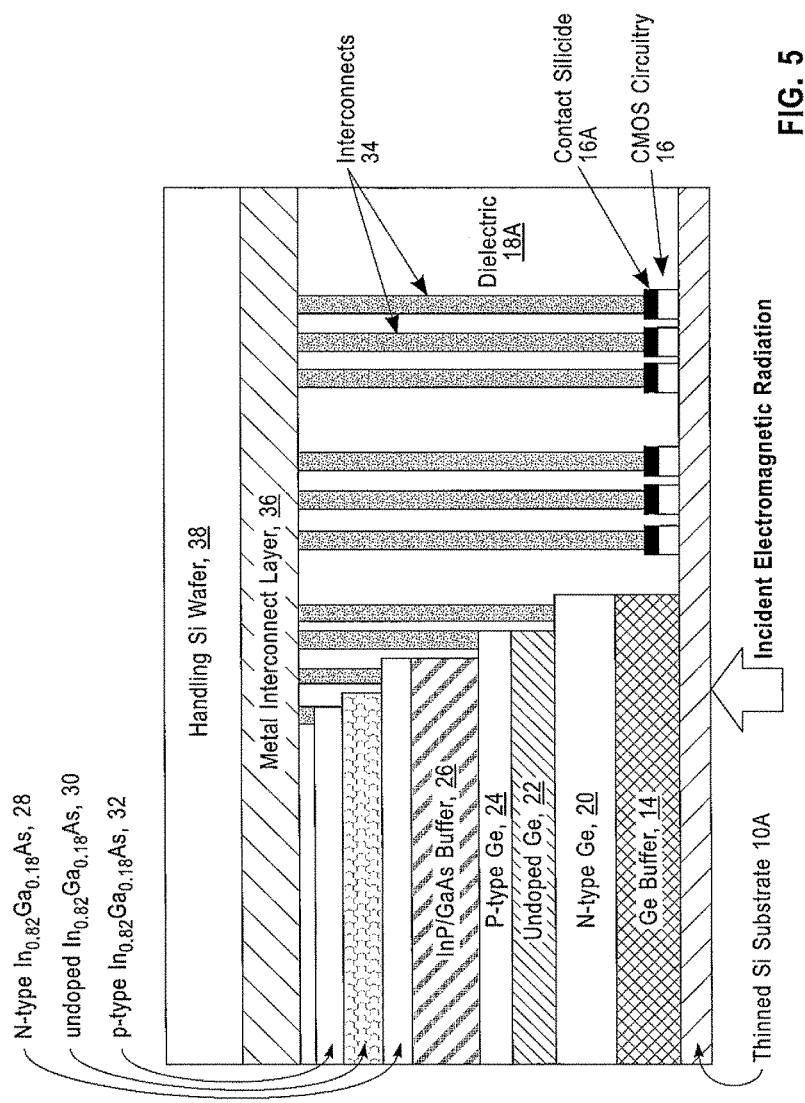

FIG. 5 illustrates an alternate, non-SOI embodiment. In this embodiment the Ge buffer layer 14 is grown directly on the top surface of the Si substrate 10 in the radiation detector region. In this alternate embodiment the various layer thicknesses and overall processing can be substantially the same as or identical to the process flow described in FIGS. 2-4.

Figure 7:
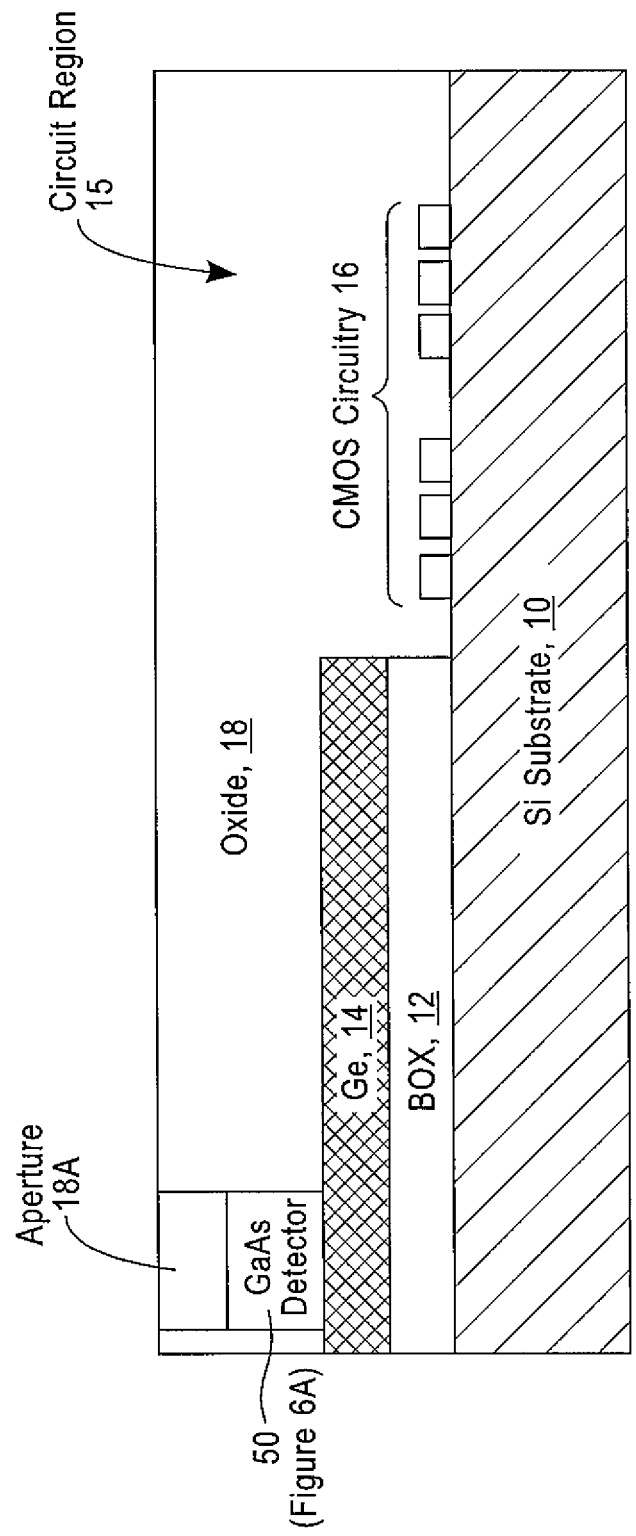

FIG. 7 shows a starting structure for a first, lateral photodetector front-side illuminated embodiment. The starting structure is comprised of the silicon substrate 10 having the overlying BOX layer 12 and the SOI comprised of a Ge layer 14. An etching process is performed (a multi-step etching process) where a portion of the Ge layer 14 and the underlying BOX layer 12 are removed to expose a surface of the silicon substrate 10 in what will be the circuit region 15. In the circuit region 15 is formed by conventional silicon processing CMOS readout and support circuitry 16 for the subsequently formed visible and IR radiation detectors. A typical maximum processing temperature that is achieved during the CMOS processing is about 1000° C. (prior to a siliciding step). As was noted above for the embodiments of FIGS. 1-5, a feature of this invention is to perform high temperature processing prior to the epitaxial deposition of Group III-V material layers. FIG. 7 also shows the structure after the layer of protective oxide 18 (e.g., $SiO_2$) is grown so as to cover the CMOS circuitry 16. An aperture 18A is then opened in the oxide layer 18 above the SOI layer where a first visible photodetector is desired, followed by the epitaxial growth of a GaAs photodetector 50 within the aperture 18A. The aperture 18A extends to the surface of the Ge layer 14.

Figure 6A:
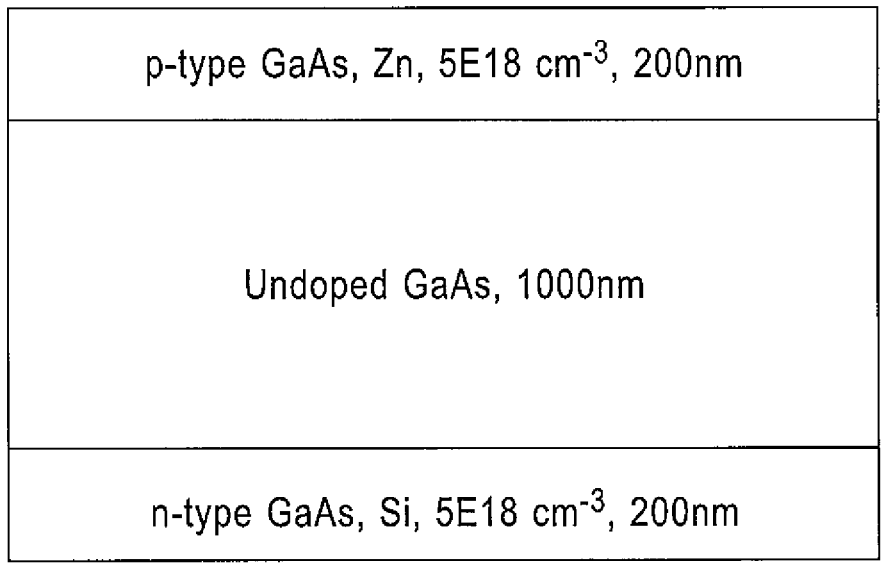

FIG. 6A shows the GaAs photodetector 50 in greater detail. In a non-limiting embodiment the GaAs photodetector 50 can be formed as N-type GaAs layer that is grown on the Ge layer 14 to have a thickness of about 200 nm. The N-type GaAs layer can be doped with, for example, Si with a dopant concentration of about 5E18 $cm^{-3}$. A substantially undoped intrinsic GaAs layer is then grown to have a thickness of about 1000 nm, followed by the growth of a P-type GaAs layer having a thickness of about 200 nm. The P-type GaAs layer can be doped with, for example, Zn with a dopant concentration of about 5E18 $cm^{-3}$. The GaAs P-I-N photodetector 50 is responsive to wavelengths of less than about 870 nm (i.e., visible wavelengths).

Figure 8:
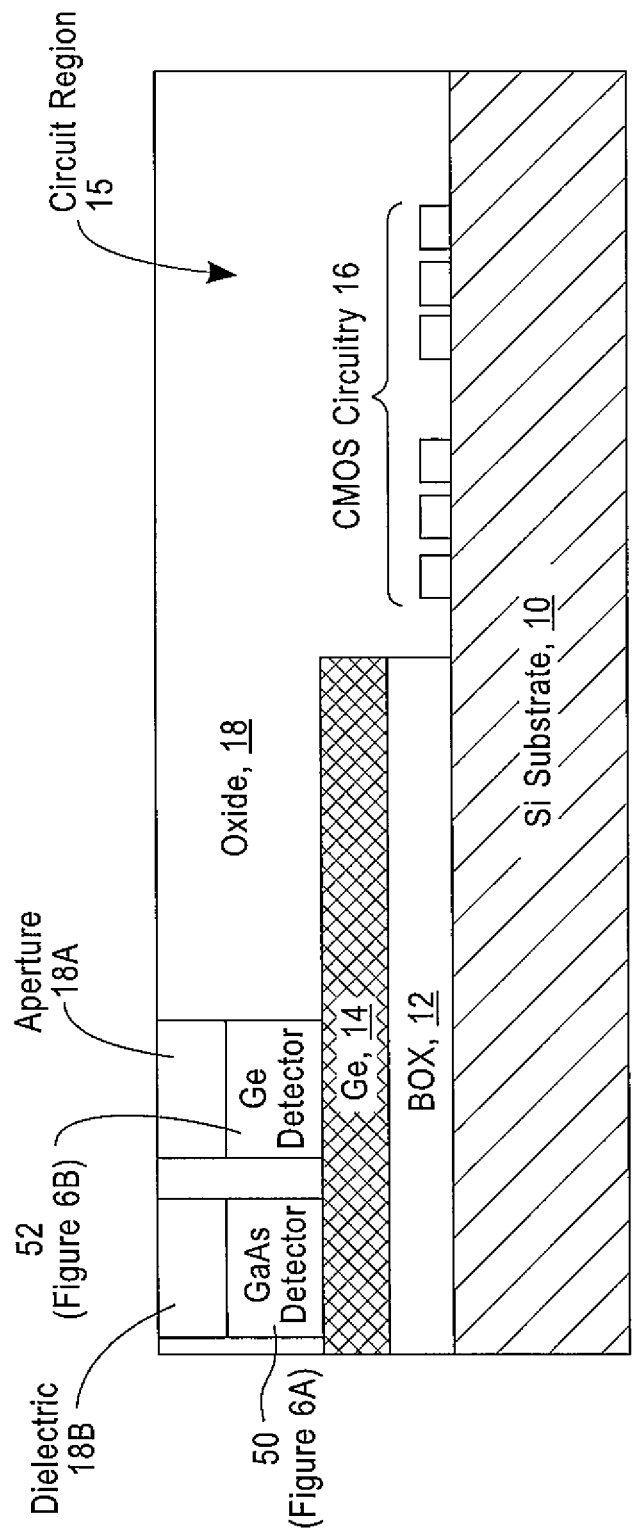

FIG. 8 shows a result of the opening of a second aperture in the oxide layer 18 (to the surface of the Ge layer 14) and the fabrication of a second photodetector (a visible wavelength Ge photodetector 52) in the second aperture. Prior to epitaxially depositing the Ge photodetector 52 that portion of the first aperture 18A that remains above the GaAs detector 50 can be filled with a dielectric material 18B such as an oxide.

Figure 6B:
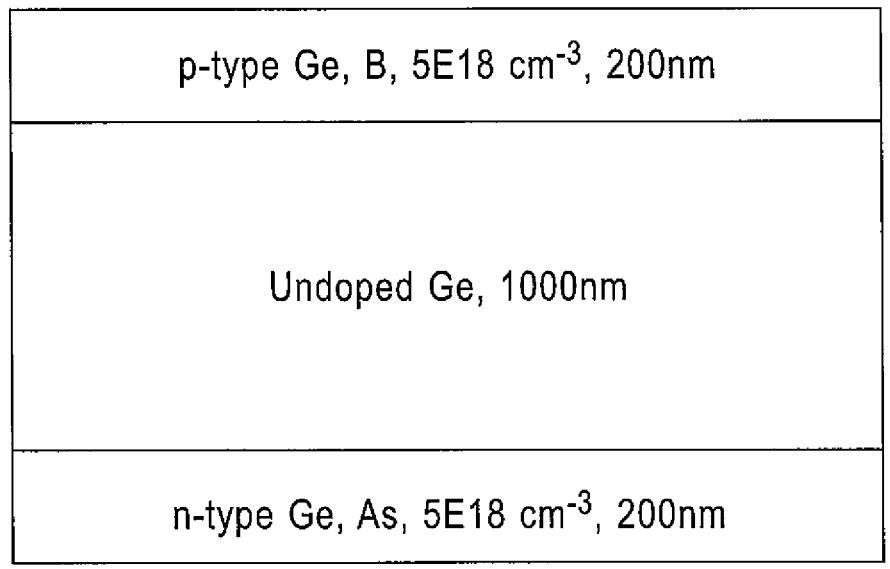

FIG. 6B shows the Ge photodetector 52 in greater detail. An N-type Ge layer is grown on the Ge layer 14 to have a thickness of about 200 nm. The N-type Ge layer can be doped with, for example, Arsenic dopant concentration of about 5E18 $cm^{-3}$. A substantially undoped intrinsic Ge layer is then grown to have a thickness of about 1000 nm, followed by the growth of a P-type Ge layer having a thickness of about 200 nm. The P-type Ge layer can be doped with, for example, Boron with a dopant concentration of about 5E18 $cm^{-3}$. The Ge P-I-N photodetector 52 is responsive to wavelengths of less than about 1.3 μm.

Figure 9:
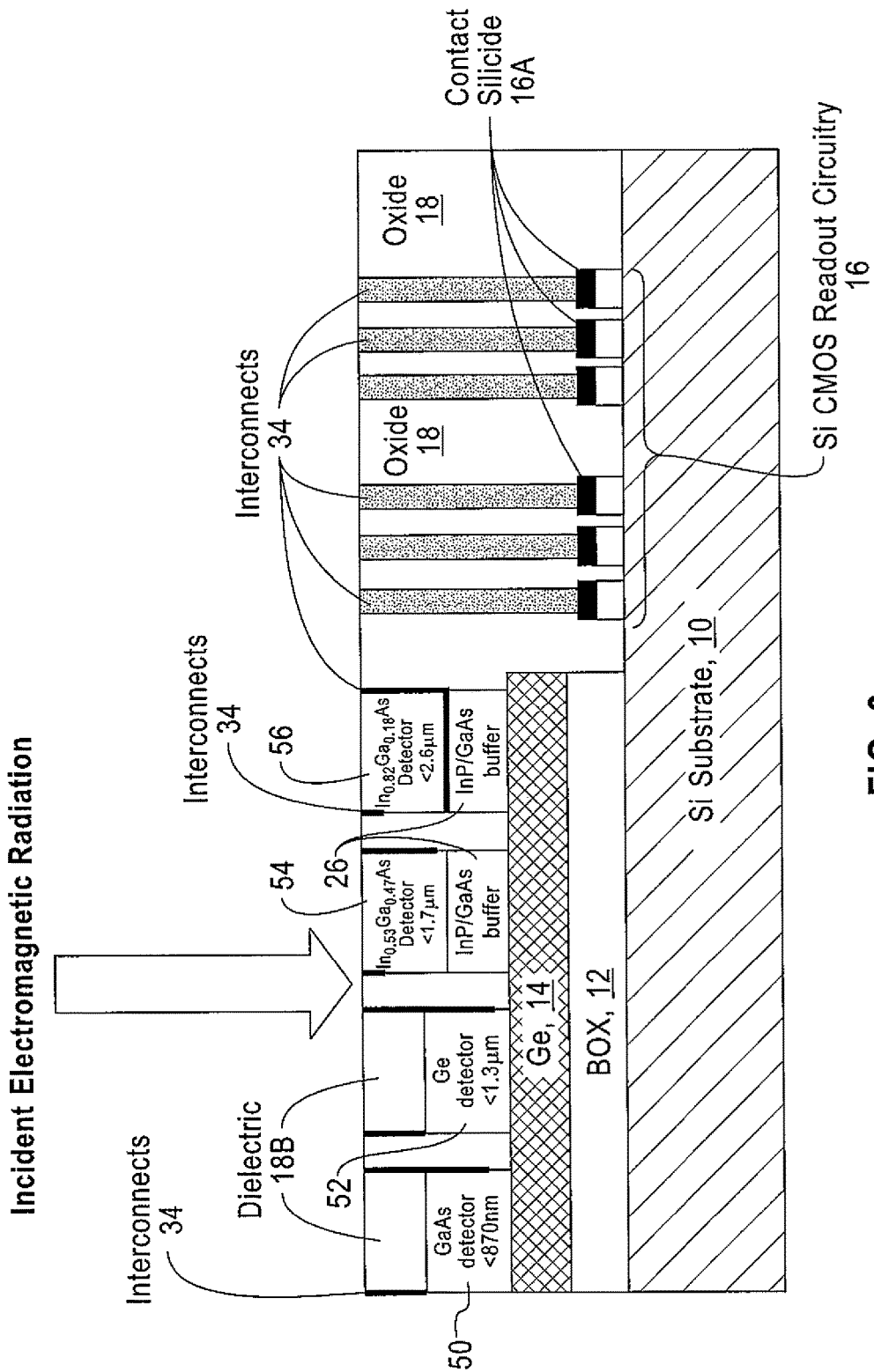

FIG. 9 shows a completed lateral photodetector FPA after the additional fabrication of two lateral IR Group III-V photodetectors and the formation of interconnects between the visible and IR photodetectors and the CMOS readout circuitry. To form the structure of FIG. 9, after epitaxially depositing the Ge photodetector 52 that portion of the second aperture 18A that remains above the Ge detector 52 can be filled with the dielectric material 18B. Two additional apertures 18A are then opened in sequence (or simultaneously) to expose the top surface of the Ge layer 14. Into each aperture is deposited the InP/GaAs buffer layer 26 followed by the deposition of a first InGaAs photodetector 54 (shown in FIG. 6C) and a second InGaAs photodetector 56 (shown in FIG. 6D). The InGaAs photodetector 54 is responsive to wavelengths of less than about 1.7 μm while the InGaAs photodetector 56 is responsive to wavelengths of less than about 2.6 µm. The total wavelength range thus spanned in this non-limiting embodiment of a multi-color FPA extends from less than about 870 nm (photodetector 50) to less than about 2.6 µm (photodetector 56).

FIG. 6C shows the InGaAs photodetector 54 in greater detail. In a non-limiting embodiment the InGaAs photodetector 54 can be formed by growing an N-type InP layer that has a thickness of about 200 nm. The N-type InP is doped N-type using, for example, Si with a dopant concentration of about 5E18 cm$^{-3}$. This is followed by the growth of a substantially undoped (intrinsic) layer of InGaAs layer having, in a non-limiting embodiment, the composition $In_{0.53}Ga_{0.47}As$ and a thickness of about 1000 nm. This is followed by the growth of a P-type InAlAs layer having, in a non-limiting embodiment, the composition $In_{0.52}Al_{0.48}As$ and a thickness of about 200 nm. This layer can be doped P-type using, for example, Zn with a dopant concentration of about 5E18 cm$^{-3}$.

FIG. 6D shows the InGaAs photodetector 56 in greater detail. In a non-limiting embodiment the InGaAs photodetector 56 can be formed as an N-type InGaAs layer having, in a non-limiting embodiment, the composition $In_{0.82}Ga_{0.18}As$ with a thickness of about 200 nm. The N-type InGaAs is doped N-type using, for example, Si with a dopant concentration of about 5E18 cm$^{-3}$. This is followed by the growth of a substantially undoped (intrinsic) layer of InGaAs layer having, in a non-limiting embodiment, the composition $In_{0.82}Ga_{0.18}As$ and a thickness of about 1000 nm. This is followed by the growth of a P-type InGaAs layer having, in a non-limiting embodiment, the composition $In_{0.82}Ga_{0.18}As$ and a thickness of about 200 nm. This layer can be doped P-type using, for example, Zn with a dopant concentration of about 5E18 cm$^{-3}$.

In the photodetectors 54 and 56 the presence of the intrinsic layer is optional.

After forming the photodetectors 50-56 a mesa etch process is performed to expose edge surfaces (as in FIG. 4) and contacts are formed on the exposed edge surfaces. In this embodiment each photodetector 50-56 includes two edge contacts, one on the N-type material and one on the P-type material. Apertures are then opened, the CMOS readout circuit transistors have the contact silicide 16A formed (at a temperature of about 400° C.), followed by the formation of vertical conductive interconnects 34 (e.g., Cu, Al, Au, etc.) to the silicided contacts 16A and to the contacts formed on the edge portions of the photodetectors 50, 52, 54 and 56. Top-side horizontal metal traces are then added to connect the vertical conductive interconnects 34 of the photodetectors 50-54 to the vertical conductive interconnects 34 connected to the CMOS readout circuitry 16. In this front-side illuminated embodiment the top surface acts as a receiving surface for incident EM radiation.

Figure 6E:
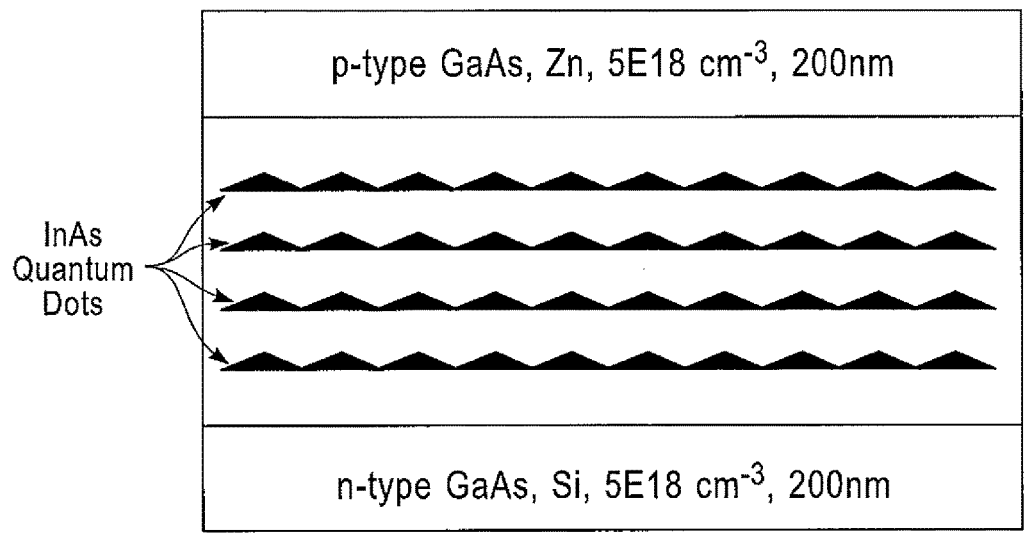
Figure 6F:
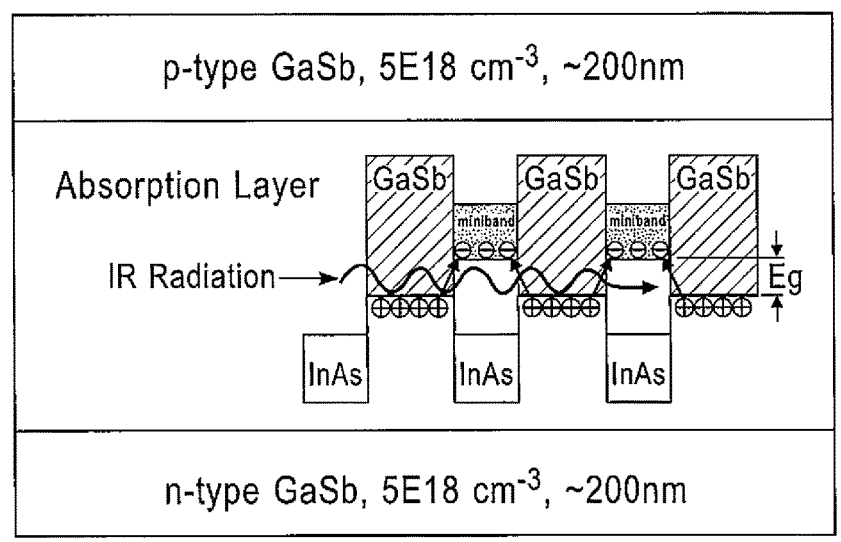

It is pointed out that in this and the other described embodiments other photodetector types can be employed in addition to or in place of the photodetectors 50-56. For example, FIG. 6E shows an example of a quantum dot IR photodetector structure wherein a region containing InAs quantum dots is interposed between an N-type GaAs layer and a P-type GaAs layer, each having a thickness of, for example, about 200 nm. FIG. 6F shows an example of a Type II heterojunction IR photodetector structure, wherein thin layers of InAs and GaSb alternate with one another within a heterojunction region that is interposed between an N-type GaSb layer and a P-type GaSb layer, each having a thickness of, for example, about 200 nm.

Figure 10:
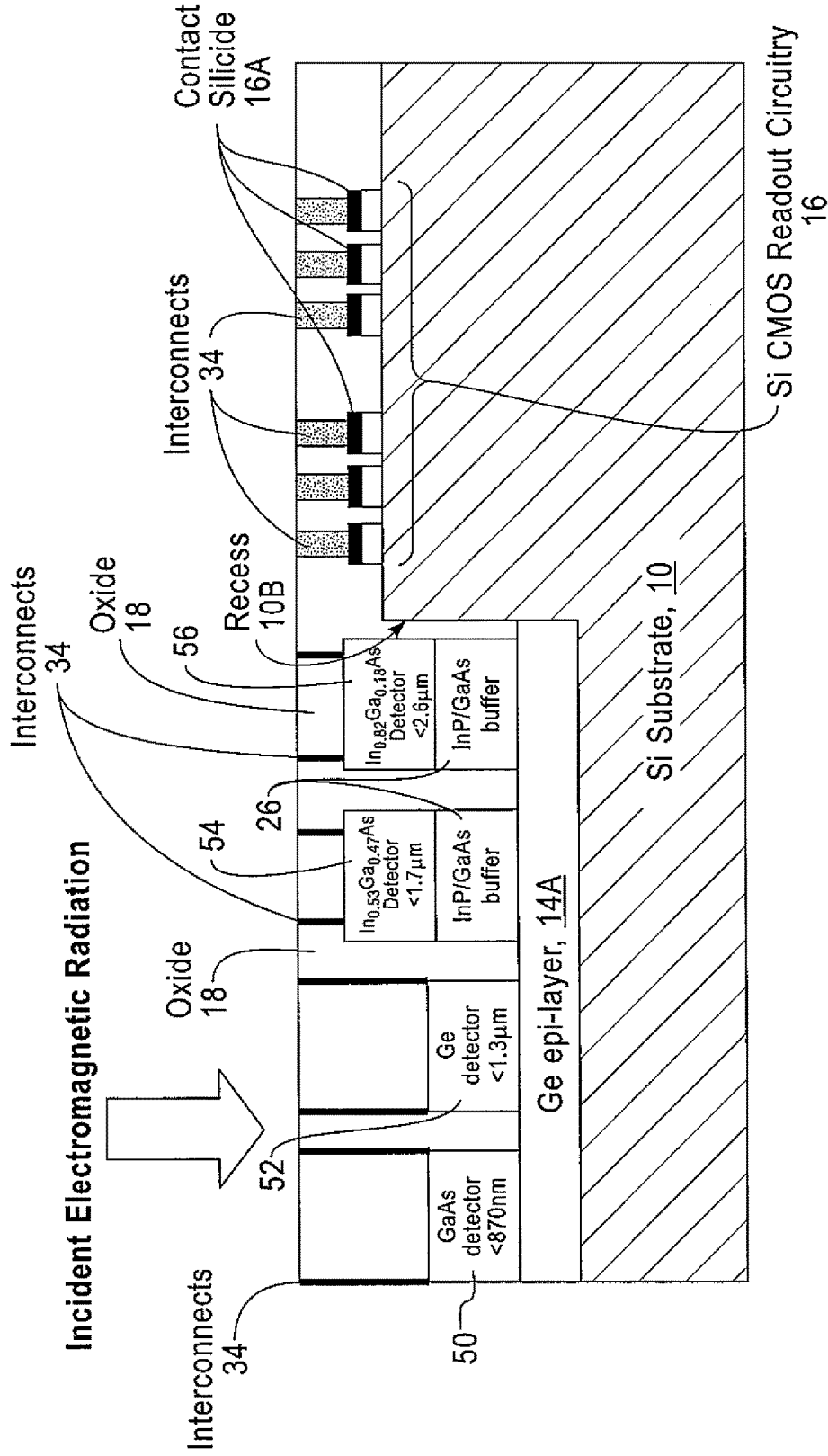

FIG. 10 shows a bulk Si substrate embodiment that forms, by etching, a recess 10B in the Si substrate 10 wherein the photodetectors 50-56 are fabricated. Either before or after forming the recess 10B the Si CMOS readout circuitry 16 is fabricated. At the bottom of the recess a Ge epitaxial layer (epi-layer) 14A is grown. One suitable thickness for the Ge epi-layer 14A is about 50 nm. This is followed, as in FIGS. 7, 8 and 9, by the deposition of the oxide 18, the opening of the apertures 18A, 18B, etc. and the growth of the photodetectors 50, 52, 54 and 56. The contact silicide 18A is formed on the readout transistors and the vertical interconnects 34 are formed to the CMOS readout circuitry 18 and to the photodetectors 50-56 as was described above in reference to FIG. 9. Top-side horizontal metal traces are then added to connect the vertical conductive interconnects 34 of the photodetectors 50-54 to the vertical conductive interconnects 34 connected to the CMOS readout circuitry 16. In this front-side illuminated embodiment the top surface acts as a receiving surface for incident EM radiation. In this non-limiting embodiment the recess 10B is etched to a depth in the Si substrate 10 that is sufficient to at least accommodate the thicknesses of the Ge epi-layer 10B and the layer thicknesses of the individual photodetectors 50-56, e.g., at least about 1500 nm.

Figure 11:
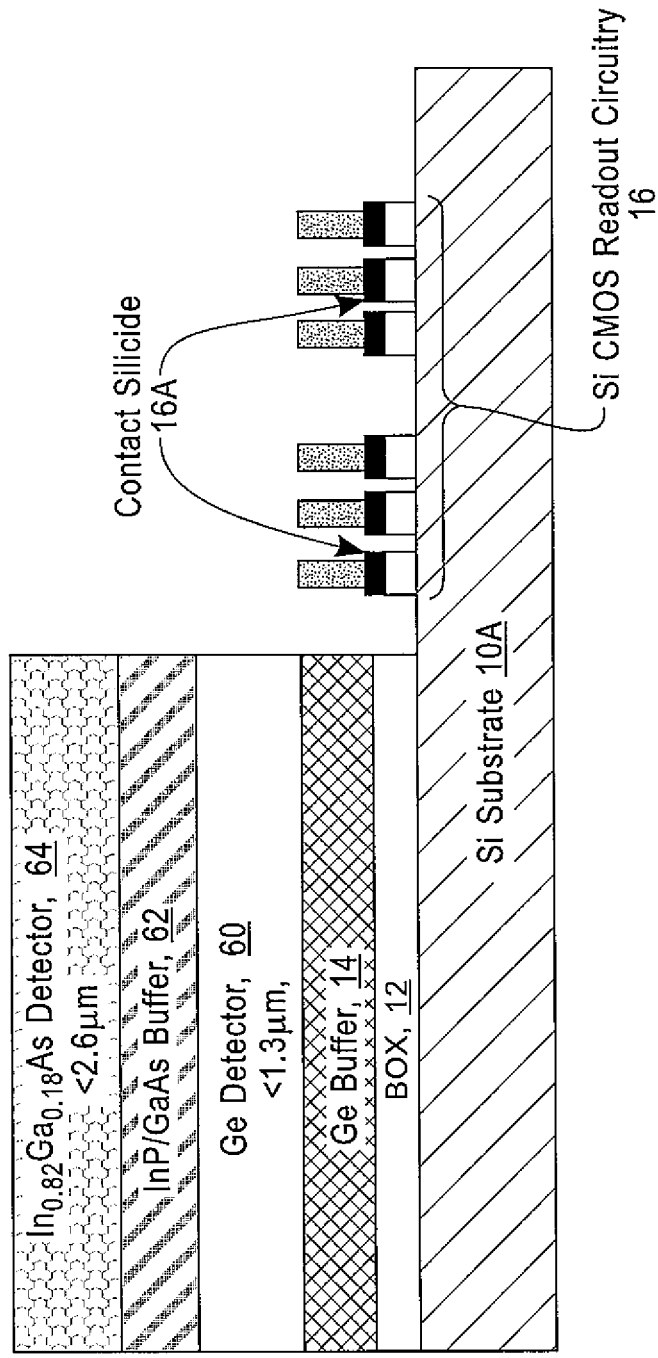
Figure 12:
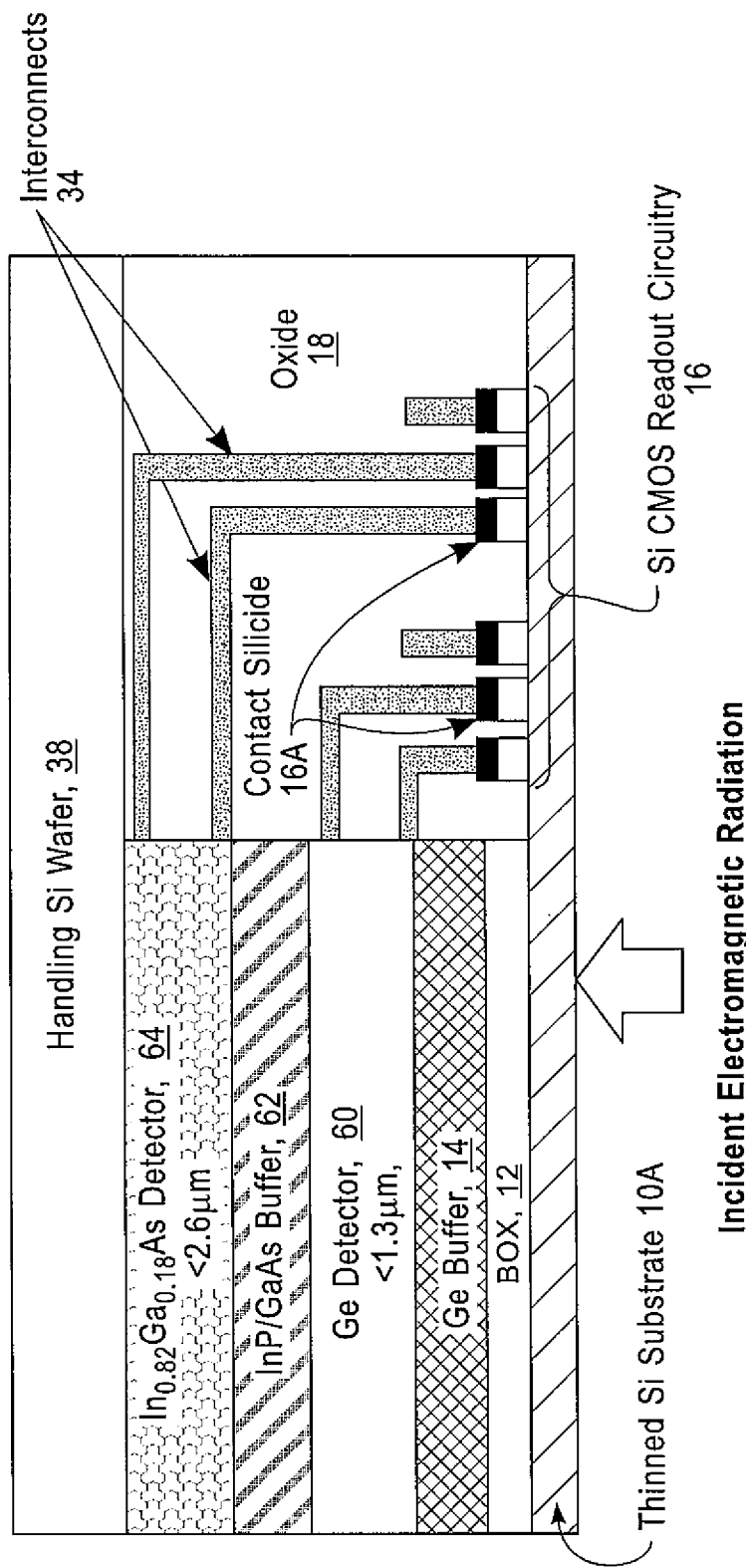

FIGS. 11 and 12 illustrate the fabrication of a back-side illuminated FPA embodiment that uses photoconductive Ge and Group III-V detectors as opposed to the photodetector embodiments described thus far. Processing starts with a SOI wafer, where the silicon substrate 10 can have any desired thickness (it is subsequently thinned), the BOX layer 12 can have an exemplary thickness of about 100 nm and the Ge layer 14 can have an exemplary thickness of about 50 nm. FIG. 11 shows the SOI structure after removal of the BOX 12 and Ge layer 14 in the circuit region, and processing to form the Si CMOS readout circuitry 16, including the eventual formation of the contact silicide 16A, on the Si substrate 10. On the Ge layer 14 is then epitaxially grown a photoconductive Ge layer detector 60 (responsive to wavelengths <1.3 µm), an InP/GaAs buffer layer 62 and a photoconductive $In_{0.82}Ga_{0.18}As$ layer detector 64 (responsive to wavelengths <2.6 µm). In this photoconductive embodiment the Ge detector layer 60 can have a thickness in a range of about 10 nm to about 500 nm, the InP/GaAs buffer layer 62 can have a thickness in a range of about 50 nm to about 1000 nm, and the $In_{0.82}Ga_{0.18}As$ detector layer 64 can have a thickness in a range of about 500 nm to about 2000 nm. In this embodiment the layers 60 and 64 can be undoped or substantially undoped (i.e., intrinsic or substantially intrinsic layers).

FIG. 12 shows the structure of FIG. 11 after formation of the oxide 18, fabrication of vertical and horizontal interconnects 34 that connect the Ge detector layer 60 and the $In_{0.82}Ga_{0.18}As$ detector layer 64 to the CMOS readout circuitry 16 via the contact silicide 16A. A Si handling wafer 38 is applied to provide structure support, and the Si substrate 10 is thinned to form a thinned Si substrate 10A. In that the bottom surface of the thinned Si substrate 10A functions as the receiving surface for the incident EM radiation in this back-side illuminated visible and IR detector embodiment, one suitable thickness for the thinned Si substrate 10A is about 100 nm or less.

It is pointed out that in some of the photodetector embodiments described above the intrinsic layer can be omitted and replaced with a lightly doped layer.

The vertically stacked and lateral radiation detecting structures shown in FIGS. 4, 5, 9 and 10 each function as a single pixel in a multi-pixel radiation detector. In practice some thousands or millions of the stacked or lateral Ge P-I-N visible wavelength photodetectors and the stacked or lateral InGaAs P-I-N IR wavelength photodetectors (pixel structures) are fabricated on the common Si substrate 10 to form a FPA circuit. Additional circuitry, in addition to the CMOS readout circuitry 16, can also be provided such as conventional pixel row and column multiplexers, etc. All of this circuitry shares the common Si substrate in a monolithic manner. The same applies to the photoconductive embodiments such as the one shown in FIG. 12. In embodiments of this invention there can be two, three, four or more discrete photodetectors provided per pixel, where each photodetector is responsive to a different range of EM radiation wavelengths (possibly overlapping a wavelength range or ranges of one or more other photodetectors within the pixel).

An integrated circuit in accordance with the present invention can be employed in applications, hardware, and/or electronic systems. Suitable hardware and systems in which such integrated circuits can be incorporated include, but are not limited to, any device wherein imaging capability is desired, including for example personal computers, portable computing and/or communications devices (e.g., cell phones) and stand-alone cameras and other imaging devices. Systems and hardware incorporating such integrated circuits are considered part of this invention. Given the teachings of the invention provided herein, one of ordinary skill in the art will be able to contemplate other implementations and applications of the techniques of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent semiconductor fabrication processes, including deposition processes and etching processes may be used by those skilled in the art. Further, the exemplary embodiments are not intended to be limited to only those materials, metals, insulators, N-type dopants, P-type dopants, dopant concentrations, layer thicknesses and the like that were specifically disclosed above.

For example, the embodiments of this invention can be practiced using Group II-VI materials.

Furthermore, the invention is not to be construed as being limited to only the specific Group III-V compositions described above. For example, other relative percentages of the constituent Group III-V materials can be used and thus the wavelength absorption range adjusted accordingly.

Any and all such and similar modifications of the teachings of this invention will still fall within the scope of this invention.

What is claimed is:

1. A method, comprising
providing a silicon substrate;
forming silicon readout circuitry on a first portion of a top surface of the silicon substrate; and
forming a radiation detecting pixel on a second portion of the top surface of the silicon substrate, the radiation detecting pixel being comprised of a plurality of radiation detectors connected -with the silicon readout circuitry, where the plurality of radiation detectors are formed to comprise at least one visible wavelength radiation detector comprised of germanium and -at least one infrared wavelength radiation detector comprised of a Group III-V semiconductor material;
where the substrate comprises a layer of oxide disposed on the second portion of the surface of the silicon substrate and a layer of germanium disposed on the layer of oxide, where the plurality of radiation detectors are formed to each comprise a plurality of layers of semiconductor material disposed above the layer of germanium and vertically adjacent to one another in a stacked manner.

2. The method as in claim 1, where the substrate comprises a layer of oxide disposed on the second portion of the surface of the silicon substrate and a layer of germanium disposed on the layer of oxide, where the plurality of radiation detectors are formed to each comprise a plurality of layers of semiconductor material disposed above the layer of germanium and laterally adjacent to one another.

3. The method as in claim 1, where the substrate comprises a layer of germanium disposed on the second portion of the surface of the silicon substrate, where the plurality of radiation detectors are formed to each comprise a plurality of layers of semiconductor material disposed above the layer of germanium and vertically adjacent to one another in a stacked manner.

4. The method as in claim 1, where the substrate comprises a layer of germanium disposed on the second portion of the surface of the silicon substrate, where the plurality of radiation detectors are formed to each comprise a plurality of layers of semiconductor material disposed above the layer of germanium and laterally adjacent to one another.

5. The method as in claim 1, where the at least one visible wavelength radiation detector comprised of germanium is formed to comprise a P-I-N photodetector and where the at least one infrared wavelength radiation detector comprised of Group III-V semiconductor material is formed to comprise a P-I-N photodetector.

6. The method as in claim 1, where the at least one visible wavelength radiation detector comprised of germanium is formed to comprise a photoconductive layer and where the at least one infrared wavelength radiation detector comprised of Group III-V semiconductor material is formed to comprise a photoconductive layer.

7. The method as in claim 1, where the at least one visible wavelength radiation detector comprised of germanium is formed to comprise a first P-I-N photodetector, where the at least one infrared wavelength radiation detector comprised of Group III-V semiconductor material is formed to comprise a second P-I-N photodetector that is disposed vertically above the visible wavelength radiation detector comprised of germanium, and further comprising forming a buffer layer comprised of Group III-V material that is interposed between the first P-I-N photodetector and the second P-I-N photodetector, further comprising thinning the silicon substrate, where a bottom surface of the thinned silicon substrate opposite the top surface of the silicon substrate is a radiation receiving surface.

8. The method as in claim 1, where the substrate comprises a layer of germanium disposed on the second portion of the surface of the silicon substrate, where the at least one visible wavelength radiation detector comprised of germanium is formed to comprise a first P-I-N photodetector disposed on the layer of germanium, where the at least one infrared wavelength radiation detector comprised of Group III-V semiconductor material is formed to comprise a second P-I-N photodetector that is disposed above the layer of germanium and laterally adjacent to the visible wavelength radiation detector comprised of germanium, and further comprising forming a buffer layer comprised of Group III-V material that is interposed between the. second P-I-N photodetector and the layer of germanium, and where a radiation receiving surface of the structure is a surface opposite to a bottom surface of the silicon substrate.

9. The method as in claim 1, further comprising recessing the second portion of the surface of the silicon substrate so as to be below the first portion of the surface of the silicon substrate prior to forming the radiation detecting pixel.

10. A method, comprising:
providing a silicon substrate;
forming silicon readout circuitry on a first portion of a top surface of the silicon substrate; and
forming a radiation detecting pixel on a second portion of the top surface of the silicon substrate, the radiation detecting pixel being comprised of a plurality of radiation detectors connected with the silicon readout circuitry, where the plurality of radiation detectors are formed to comprise at least one visible wavelength radiation detector comprised of germanium and at least one infrared wavelength radiation detector comprised of a Group III-V semiconductor material;
where the substrate comprises a layer of oxide disposed on the second portion of the surface of the silicon substrate and a layer of germanium disposed on the layer of oxide, where the plurality of radiation detectors are formed to each comprise a plurality of layers of semiconductor material disposed above the layer of germanium and laterally adjacent to one another.

11. The method as in claim 10, where the substrate comprises a layer of germanium disposed on the second portion of the surface of the silicon substrate, where the plurality of radiation detectors are formed to each comprise a plurality of layers of semiconductor material disposed above the layer of germanium and vertically adjacent to one another in a stacked manner.

12. The method as in claim 10, where the substrate comprises a layer of germanium disposed on the second portion of the surface of the silicon substrate, where the plurality of radiation detectors are formed to each comprise a plurality of layers of semiconductor material disposed above the layer of germanium and laterally adjacent to one another.

13. The method as in claim 10, where the at least one visible wavelength radiation detector comprised of germanium is formed to comprise a P-I-N photodetector and where the at least one infrared wavelength radiation detector comprised of Group III-V semiconductor material is formed to comprise a P-I-N photodetector.

14. The method as in claim 10, where the at least one visible wavelength radiation detector comprised of germanium is formed to comprise a photoconductive layer and where the at least one infrared wavelength radiation detector comprised of Group III-V semiconductor material is formed to comprise a photoconductive layer.

15. The method as in claim 10, further comprising recessing the second portion of the surface of the silicon substrate so as to be below the first portion of the surface of the silicon substrate prior to forming the radiation detecting pixel.

16. A method, comprising
providing a silicon substrate;
forming silicon readout circuitry on a first portion of a top surface of the silicon substrate; and
forming a radiation detecting pixel on a second portion of the top surface of the silicon substrate, the radiation detecting pixel being comprised of a plurality of radiation detectors connected with the silicon readout circuitry, where the plurality of radiation detectors are formed to comprise at least one visible wavelength radiation detector comprised of germanium and at least one infrared wavelength radiation detector comprised of a Group III-V semiconductor material;
further comprising recessing the second portion of the surface of the silicon substrate so as to be below the first portion of the surface of the silicon substrate prior to forming the radiation detecting pixel.

17. The method as in claim 16, where the substrate comprises a layer of germanium disposed on the second portion of the surface of the silicon substrate, where the plurality of radiation detectors are formed to each comprise plurality of layers of semiconductor material disposed above the layer of germanium and vertically adjacent to one another in a stacked manner.

18. The method as in claim 16, where the substrate comprises a layer of germanium disposed on the second portion of the surface of the silicon substrate, where the plurality of radiation detectors are formed to each comprise a plurality of layers of semiconductor material disposed above the layer of germanium and laterally adjacent to one another.

19. The method as in claim 16, where the at least one visible wavelength radiation detector comprised of germanium is formed to comprise a P-I-N photodetector and where the at least one infrared wavelength radiation detector comprised of Group III-V semiconductor material is formed to comprise a P-I-N photodetector.

20. The method as in claim 16, where the at least one visible wavelength radiation detector comprised of germanium is formed to comprise a photoconductive layer and where the at least one infrared wavelength radiation detector comprised of Group III-V semiconductor material is formed to comprise a photoconductive layer.

* * * * *